United States Patent [19]

Manning

[11] Patent Number: 5,539,703
[45] Date of Patent: * Jul. 23, 1996

[54] DYNAMIC MEMORY DEVICE INCLUDING APPARATUS FOR CONTROLLING REFRESH CYCLE TIME

[75] Inventor: Troy A. Manning, Boise, Id.

[73] Assignee: Micron Technology, Inc., Boise, Id.

[*] Notice: The term of this patent shall not extend beyond the expiration date of Pat. No. 5,392,251.

[21] Appl. No.: 395,369

[22] Filed: Feb. 21, 1995

Related U.S. Application Data

[63] Continuation of Ser. No. 91,697, Jul. 13, 1993, Pat. No. 5,392,251.
[51] Int. Cl.⁶ ..................................................... G11C 11/40
[52] U.S. Cl. ............................................. 365/222; 365/149
[58] Field of Search ...................................... 365/222, 149, 365/233, 210, 194, 148

[56] References Cited

U.S. PATENT DOCUMENTS

| | | | |
|---|---|---|---|
| 4,406,013 | 10/1983 | Reese et al. | 377/29 |
| 4,716,551 | 12/1987 | Inagaki | 365/222 |
| 4,901,283 | 2/1990 | Hanbury et al. | 365/222 |
| 4,982,369 | 1/1991 | Tatematsu | 365/222 |
| 5,033,026 | 7/1991 | Tsujimoto | 365/222 |
| 5,278,797 | 1/1994 | Jeon et al. | 365/222 |
| 5,392,251 | 2/1995 | Manning | 365/222 |

FOREIGN PATENT DOCUMENTS

| | | | |
|---|---|---|---|
| 55-150191 | 11/1980 | Japan | G11C 11/34 |
| H2-199694 | 1/1989 | Japan | G11C 11/406 |
| 4-205883 | 7/1992 | Japan | G11C 11/406 |

*Primary Examiner*—David C. Nelms
*Assistant Examiner*—Vũ A. Lê
*Attorney, Agent, or Firm*—Kirkpatrick & Lockhart

[57] ABSTRACT

Self refresh timing in a low-power dynamic memory system is governed by an oscillator having a voltage dependent resistor and a process dependent capacitor. The resistor increases in resistance to compensate for increased applied power supply voltage and variation in substrate bias voltage. The total capacitance needed for a given oscillator center frequency is made up of a plurality of capacitors having the same physical characteristics as the capacitor used in the dynamic memory cell. Power supply voltage, substrate bias voltage, and the physical characteristics of the cell capacitor affect the cell's data retention time. By compensating the oscillator for these effects, refreshing is optimally accomplished within the data retention time. A system having compensated refresh timing according to the invention is more appropriate for low power applications due to the resulting decreased power consumption.

17 Claims, 4 Drawing Sheets

DYNAMIC MEMORY DEVICE INCLUDING APPARATUS FOR CONTROLLING REFRESH CYCLE TIME

This application is a continuation of application Ser. No. 08/091,697 filed on Jul. 13, 1993, now U.S. Pat. No. 5,392,251.

TECHNICAL FIELD

The present invention relates to systems having dynamic memory and particularly to refresh timing in such systems.

BACKGROUND

Information stored in a dynamic memory will be irretrievable if not periodically refreshed within a data retention time. Especially in low-power applications, it is desirable to limit the time allocated for and the power consumed during memory refreshing.

As one example of a dynamic memory, consider a dynamic random access memory (DRAM) wherein information is stored as the charge on a cell capacitor. Refreshing such a memory is necessary because the stored charge dissipates, for example, through a leakage resistance across the capacitor. The conventional DRAM includes an array of many thousands of cells arranged for refreshing a row at a time. To refresh the stored charge in each cell, a row of cells is coupled to a row of sense amplifiers until the sense amplifiers reach one of two stable states. Then, the sense amplifier outputs are coupled to the row of cells to recharge each cell to the charge level corresponding to the information originally stored therein.

Selection of rows, sense amplification, and the recharging of cells consume power in inverse proportion to a refresh cycle time. The shorter the refresh cycle time, the more power is consumed. In the conventional DRAM, refreshing is accomplished in cycles. Each row refresh cycle has a period including an active time sufficient for refreshing a row of cells plus an inactive time for other memory operations such as system level reading and writing. Power for refreshing is primarily consumed during the active time. The duration of an aggregate refresh cycle also has a period, herein called the "refresh cycle time," including an active time sufficient for refreshing all rows plus an inactive time. The refresh cycle time must match the row refresh cycle time, though the refresh cycle has considerably less inactive time than the row refresh cycle. In either cycle, it is desirable to increase the inactive time to conserve power and to increase the availability of the memory for system level operations.

Since periodic refreshing of all cells in the DRAM must be accomplished within the data retention time of each cell, the refresh cycle time must be less than the data retention time of the cell having the fastest discharge characteristics. Conventional refresh timing circuits are designed with a refresh cycle time that accommodates a worst case (minimum) data retention time. The worst case time accounts for several effects including variation in geometric tolerances and material concentrations from cell to cell and variations with bias and operating voltages.

Use of conventional refresh timing wastes power in two ways. First, use of worst case cell discharge parameters dictates application of refresh power to the average cell for a time longer than is necessary to recharge the cell, thus extending the active portion of the row refresh cycle. Second, use of the worst case data retention time dictates refreshing prior to the time when refreshing is necessary, i.e. more often than necessary. Consequently, refreshing can more frequently interrupt use of the memory for system level reading and writing, degrading system performance.

In view of these and related problems known in the art, there remains a need for conserving power in systems having dynamic memory and increasing system use of dynamic memory by increasing refresh cycle time, and especially increasing the inactive portion of refresh cycle time.

SUMMARY

Accordingly, a system in one embodiment of the present invention employs dynamic storage of information. The system includes a dynamic memory, means for refreshing the memory, and timing means for controlling the means for refreshing. The dynamic memory has a variable retention time that depends on an applied power signal.

According to a first aspect of such a system, the timing means is responsive to the power signal applied to the memory so that refreshing accommodates variation of the retention time with applied power.

An integrated circuit, according to another embodiment of the present invention, includes a dynamic memory cell for retaining and providing stored information. The cell has a data retention time that depends on a dimension of the cell. The integrated circuit further includes means for refreshing the cell and timing means for controlling the means for refreshing.

According to one aspect of such an integrated circuit, refresh timing is controlled by a timing capacitor fabricated with a dimension related to the dimension of the cell so that the cell is refreshed according to the data retention time that depends on the dimension of the cell.

In an alternate embodiment, the retention time of the cell depends on applied power in addition to depending on a dimension of the cell. In addition, the means for timing includes an oscillator and a resistor having a resistance that depends on applied power.

According to one aspect of such an integrated circuit, the oscillator clocks a circuit for selecting a cell to refresh, the clocking frequency being governed by the resistance of the resistor so that refreshing accommodates variation of applied power.

According to another aspect, the clocking frequency is additionally governed by the capacitance of a timing capacitor, fabricated with a dimension related to the dimension of the cell, so that refreshing additionally accommodates variation (lot to lot) of the data retention time due to the dimension of the cell.

The present invention may be practiced according to a method for refreshing dynamic memory cells which includes, in one embodiment, the steps of: selecting, after a period, a memory cell to refresh; reading data from the selected cell; amplifying the data read; writing the amplified information into the selected cell; and increasing the period in response to increased power signal potential applied to the memory.

According to a first aspect of such a method, by increasing the period, refreshing is performed less often, power is thereby conserved and the availability of the memory for read and write operations is thereby increased.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

In each functional block diagram, a broad arrow symbolically represents a group of signals that together signify a binary code. For example, a group of address lines is represented by a broad arrow because a binary address is signified by the signals taken together at an instant in time. A group of signals having no binary coded relationship is shown as a single line with an arrow. A single line between functional blocks represents one or more signals.

Signals that appear on several Figures and have the same mnemonic are directly or indirectly coupled together. A signal named with a mnemonic and a second signal named with the same mnemonic followed by an asterisk are related by logic inversion.

Cross sectional views are not to scale, but illustrate relationships important to understanding an embodiment of the invention. Cross sectional views are not intended to limit the scope of the invention to an illustrated set of design parameters.

DESCRIPTION OF THE INVENTION

Figure 1:
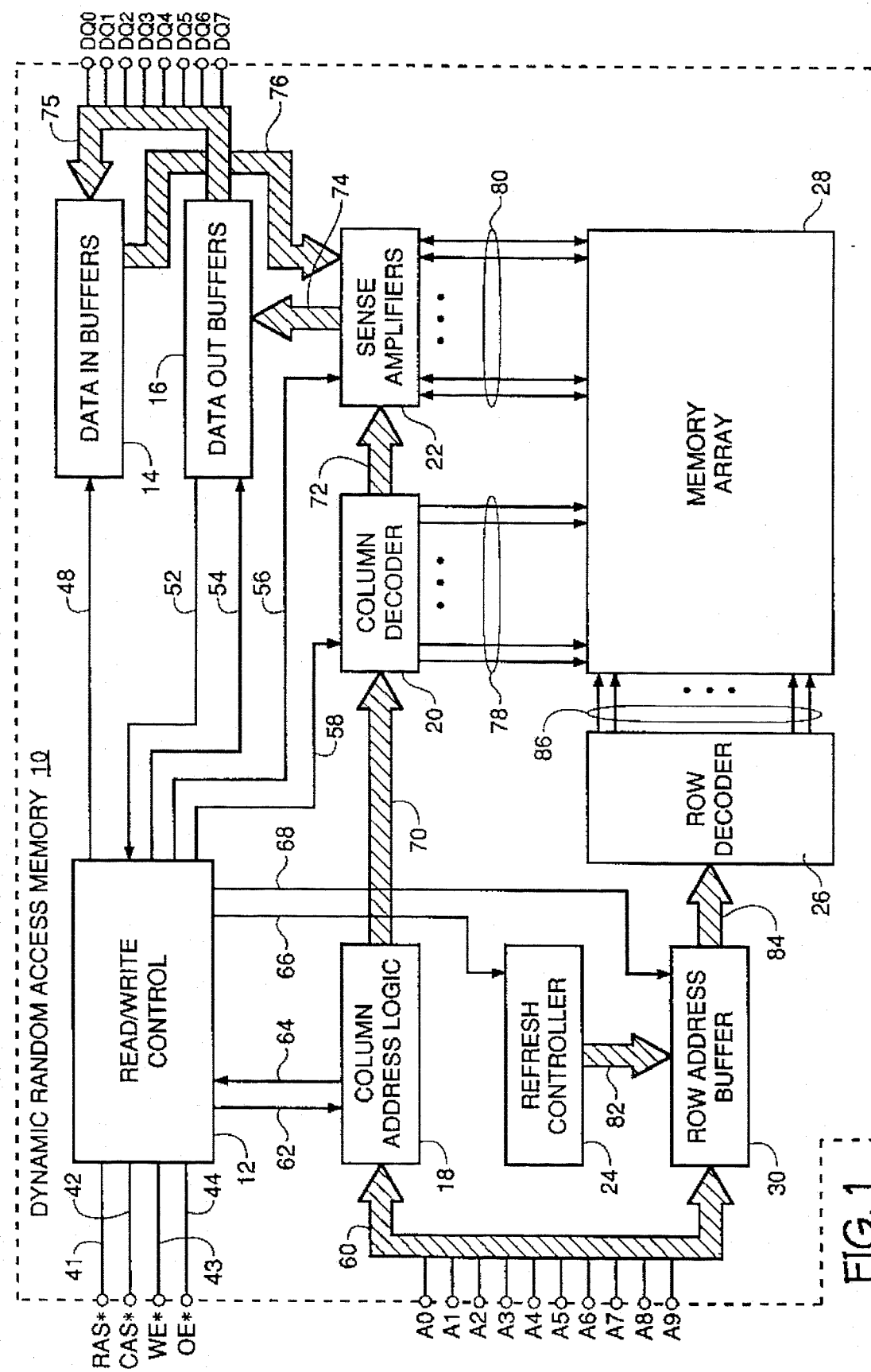
FIG. 1 is a functional block diagram of a dynamic memory according to an embodiment of the present invention.

FIG. 1 is a functional block diagram of a dynamic memory according to an embodiment of the present invention. Memory device 10 is controlled by binary control signals input on lines 41 through 44 from the device pads to read/write control 12. Control signals on lines 41–44 are conventionally known by names corresponding to the primary function of each signal. The primary signal on line 41 is row address strobe (RAS*); on line 42 is column address strobe (CAS*); on line 43 is write enable (WE*); and on line 44 is output enable (OE*). When RAS* falls, the state of address bus 60 is latched in row address buffer 30 in response to control signals on line 68. When CAS* falls, the state of address bus 60 is latched in column address logic 18 in response to control signals on line 62.

Several read and write modes of operation (also called cycles) are conducted by read/write control 12 in response to address change signals on line 64 and combinations of control signals on lines 41–44. For example, read/write control 12 responds to changes in the column address as indicated by address change signals on line 64 for improved access time as in page mode. Read/write control 12 generates control signals on lines 48–58 for two different write cycles. The first, early write, follows a RAS*, WE*, CAS* control signal sequence. The second, late write, follows a RAS*, CAS*, WE*, control signal sequence.

When RAS* falls while CAS* is low, read/write control 12 provides signals on line 66 to refresh controller 24 to enable self refreshing. Refresh controller 24 includes a clock circuit and means for selecting a cell to refresh. During self refresh mode, refresh controller 24 generates signals on refresh row address bus 82 (for example, as generated by the output of a refresh row address counter or register clocked by an oscillator) to select a row of cells to refresh. Row address buffer 30 provides signals on row address bus 84 to row decoder 26. Signals on binary row address bus 84, in response to control signals on line 68, represents either the address latched when RAS* falls or the refresh row address, depending on the mode of operation. During a refresh cycle, data signals on lines 80 from the selected row are amplified by sense amplifiers 22 causing cells in the row to be refreshed.

In addition to cell refreshing, sense amplifiers 22 respond to control signals on line 56 and column decoder signals on line 72 to perform the memory read cycle. Signals RAS*, CAS*, WE* (high), and address signals A0 through A9 cooperate to provide a control signal for a read cycle. In read operations cell content signals on lines 80 are amplified and presented to data out buffers 16 as global I/O signals on line 74. When cell contents are to be overwritten in a write operation, sense amplifiers 22 establish proper cell contents in response to write data signals on line 76 from data-in buffers 14.

Data-in buffers 14 are instrumental for write operations. Signals RAS*, CAS*, WE* (low), OE*, and address signals A0 through A9 cooperate to provide a control signal for a write cycle. In write operations cell contents are changed to correspond to the outputs on line 76 of data-in buffers 14. Data-in buffers 14 are driven by data bus 75 which comprises several individual data lines shown as $DQ_n$.

Memory device 10 has eight DQ lines, each of which is bidirectional. Alternate memory devices may have less or more DQ lines and may have separate lines for the data-in (D) function and the data-out (Q) function. In memory device 10, each bidirectional line is driven by a three state circuit to represent a logic low, a logic high, or an off state. In the off state, the three state circuit connects a high impedance to the DQ line so that drive circuits external to memory device 10 can drive a signal onto the DQ line for data-in buffer 14.

Improved refresh timing is provided in memory 10 in one embodiment by the cooperation of signals on lines 41–43 and novel functions of refresh controller 24. Realization of improved refresh timing will become more apparent upon review of lower level block diagrams to be discussed.

In an equivalent dynamic memory, not shown, storage cells are arranged in a ring rather than in a row-column array as shown in FIG. 1. In such an arrangement, control and address signals different from those shown in FIG. 1 comprise the control signals for a read and a write operation. Storage ring architectures include magnetic bubble and charge coupled devices as is well known in the art.

In another equivalent memory, not shown, memory 10 additionally includes serial access means coupled to sense amplifiers 22 for providing serial access between the memory array and a serial input/output buffer circuit. In such a memory, control signals 56 include a transfer signal for enabling data transfer between array 28 and the serial access means.

Figure 2:
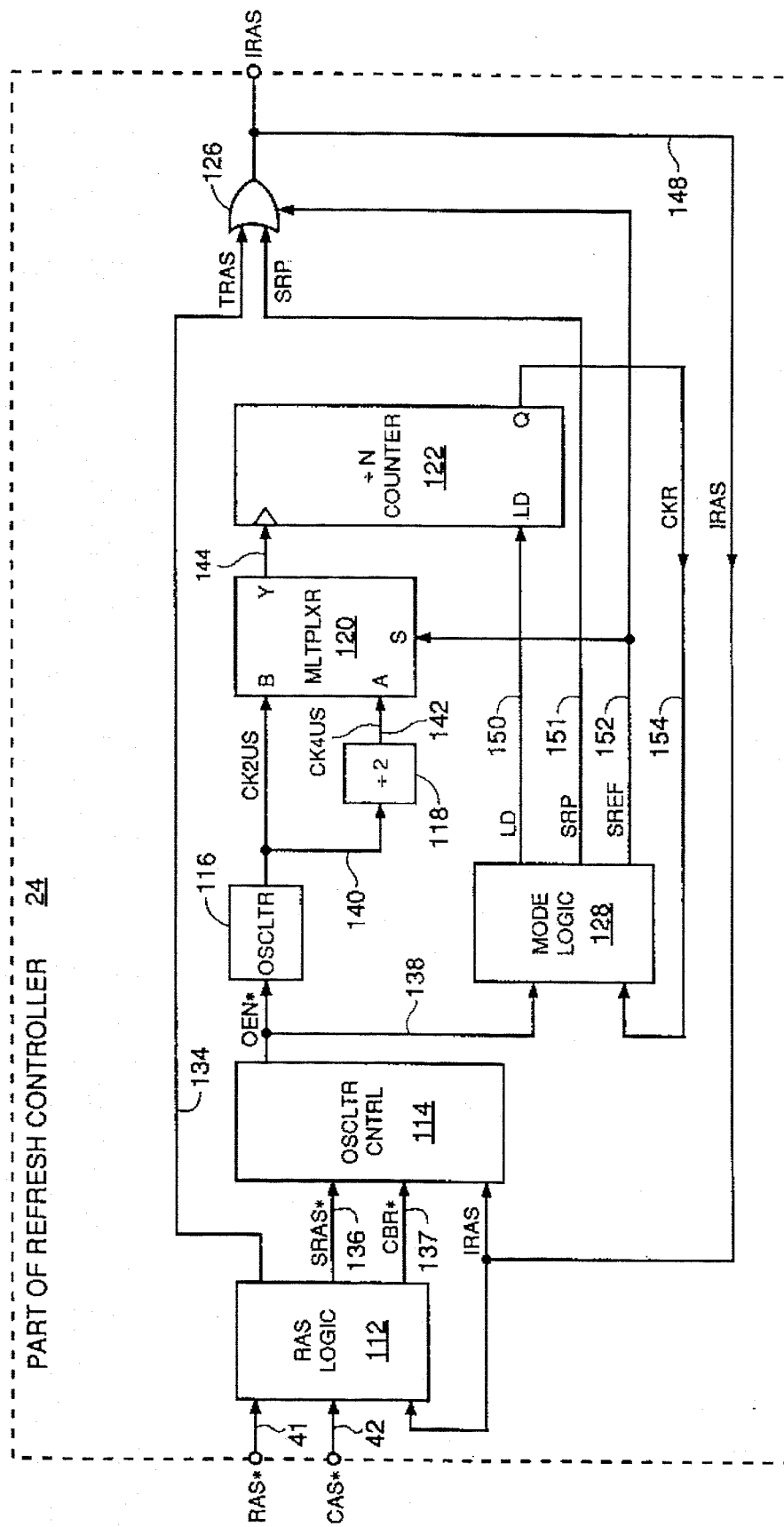
FIG. 2 is a functional block diagram of a portion of refresh controller 24 shown in FIG. 1.

FIG. 2 is a functional block diagram of a portion of refresh controller 24 shown in FIG. 1. The output of the circuit shown is signal IRAS on line 148 which is used as an internal row address strobe. In response to IRAS, a row is selected for refreshing, and a refresh row address counter, not shown, is incremented. IRAS in the embodiment shown is used to indicate the beginning of each row refresh cycle after refreshing has been initiated.

RAS logic 112 monitors signals RAS* and CAS* to detect when to initiate and terminate self refreshing and consequently generates control signals. Signal TRAS on line 134 is generated as a pulse of predetermined length and used to establish a proper pulse width for signal IRAS on line 148. The formation of the TRAS signal is triggered by signal IRAS input to RAS logic 112. Signal SRAS, on line 136 is generated by buffering signal RAS* so that termination of self refreshing follows soon after the rising edge of signal RAS*. The beginning of a CAS, before RAS* self refresh cycle is indicated by signal CBR* on line 137 for controlling refresh clock generation.

Oscillator control 114, responds to signals SRAS* and CBR, to enable oscillator 116 to oscillate during self refreshing. When enabled, oscillator 116 generates, in one embodiment, a clock having a period of about two microseconds as signal CK2US on line 140. A second clock having a period twice as long as the period of signal CK2US on line 142 results from division of signal CK2US. These clock signals are used for measuring time using a counter.

Modulo N counter 122 responds to the clock signal on line 44, selected by multiplexer 120, and to a load signal LD on line 150. Counter 122 loads an initial count in response to signal LD and counts clock signals on line 144 until a terminal count is reached, whereupon signal CKR is generated on line 154. The internal RAS signal, IRAS, is developed from signal CKR via mode logic 128.

Mode logic 128 holds counter 122 at the initial count when oscillator 116 is not enabled. When oscillator 116 is enabled, mode logic 128 generates signal LD on line 150 after the terminal count is reached, as indicated by signal CKR. In the embodiment shown, signal CKR is used to form a pulse signal SRP on line 151.

Mode logic 128 controls counter 122 as a timer for measuring the self refresh setup time and the self refresh cycle time. When signal CBR* indicates self refreshing may begin, mode logic 128 holds self refresh mode signal SREF on line 152 low so that slower clock signal CK4US is coupled to counter 122. Self refresh cycles do not begin before a self refresh setup time has elapsed during which neither a read signal nor a write signal occurs, i.e. while signal CBR* remains asserted and signals RAS, and CAS, are absent. The self refresh setup time has elapsed when the terminal count occurs and signal CKR issues as a consequence of the rate prescribed by signal CK4US and the magnitude of the initial and terminal counts.

Mode logic 128 raises signal SREF after the first terminal count is reached. When signal SREF on line 152 is high (asserted), faster clock signal CK2US is used to measure the time between back to back row refresh cycles. In the embodiment shown, the self refresh setup time is twice the self refresh cycle time and the initial count is fixed as a metal mask option during integrated circuit fabrication. Those skilled in the art understand that a selection of initial counts could be used as the functional equivalent of clock division and selection. Also, accommodation of an other than two to one relationship between the self refresh setup time and the self refresh cycle time (for example, to support burst refreshing) involves mere design choice in clock rate, initial count, terminal count, and mode logic.

After self refresh mode is entered, as indicated when signal SREF is asserted, subsequent CKR signals are coupled as SRP signals to gate 126. Signal SREF, when asserted, enables gate 126 so that signal SRP on line 151 is combined in a logic 'or' with signal TRAS through gate 126. Gate 126 provides signal IRAS on line 148 at a frequency and period controlled primarily by oscillator 116.

Figure 3:
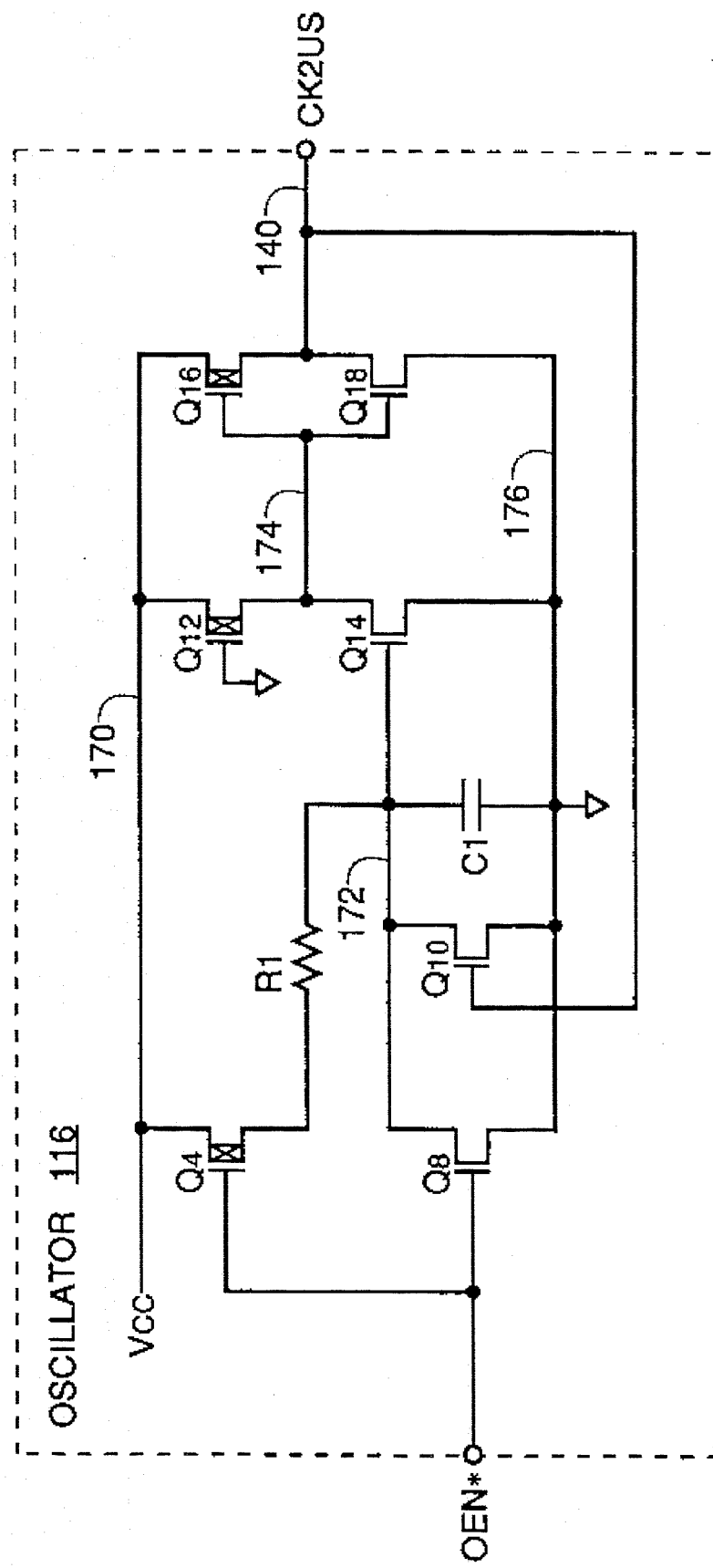
FIG. 3 is a schematic diagram of oscillator 116 shown in FIG. 2.

FIG. 3 is a schematic diagram of oscillator 116 shown in FIG. 2. Transistor Q10 provides switching means for controlling the charge on capacitor C1. Transistors Q12 and Q14 together operate as a Schmitt trigger inverter; while transistors Q16 and Q18 together operate as a conventional inverter or a Schmitt trigger inverter, depending on threshold potentials obtained by conventional doping techniques in transistors Q16 and Q18. Oscillation is enabled by a low potential signal OEN* on line 138, turning on transistor Q20.

The circuit oscillates with a period of R times C nanoseconds, where R is the resistance of resistor R1 in kilohms and C is the capacitance of capacitor C1 in picofarads. When transistor Q10 is off, charge builds on capacitor C1 due to the current through resistor R1. When the voltage on node 172 is sufficient to turn on transistor Q14, the voltage on node 174 decreases, eventually turning on transistor Q16 and turning off transistor Q18. When transistor Q18 is off, the voltage on line 140 increases due to current through transistor Q16, so that transistor Q10 is consequently turned on, thus completing one half cycle of the oscillator output signal, CK2US on line 140. The second half cycle is formed in essentially an opposite fashion as the voltages on nodes 174 and 140 cause the connected transistors to alternate from the on to off state and vice versa.

In a preferred embodiment, the resistance of resistor R1 is voltage dependent and the structure of capacitor C1 physically resembles the capacitor of a dynamic memory cell. Implementation of these features will be discussed below with reference to a first embodiment wherein R1 is voltage dependent and a second embodiment wherein C1 is process dependent.

Power consumed for refreshing generally increases with an increase in the voltage (potential) of the power signal applied to the dynamic memory, herein called $V_{CC}$. For conventional refresh timing, as $V_{CC}$ increases, refreshing is performed more frequently. More frequent refreshing consumes more power for row selection, cell recharging, refresh timing, and related functions. Some increase is necessary because the data retention time is reduced at increased $V_{CC}$.

Data retention time, generally decreases with increasing $V_{CC}$. The decrease in data retention time for a charge storage type dynamic memory cell in one embodiment is due to increased leakage current as is well understood by those skilled in the art. For a positively charged capacitor, as leakage current flows, the charge on the capacitor is decreased and the voltage across the capacitor, which represents stored information, decreases. Data retention time includes the time for the voltage to decrease below a cell threshold voltage at which the information becomes irretrievable.

Data retention time, therefore, can be modeled as an RC time constant where R is the leakage path resistance and C is $$t_X = R * C * \ln \frac{V_{CC}}{V_{CC} - V_X}$$

the capacitance of the cell capacitor. Time $t_X$ is the discharge time to a cell threshold voltage $V_X$ at which data is irretrievable.

The leakage path resistance has decreased resistance at increased $V_{CC}$ so that a larger leakage current flows. In one embodiment of a dynamic memory, the cell access transistor and cell capacitor are joined at a node having N doping in a P-silicon substrate, biased to a negative voltage. As $V_{CC}$ increases, the voltage on the substrate becomes increasingly negative, thus, increasing the voltage from the node to substrate. Since the node includes a doped or implanted region (collectively referred to as active area), the resistance to substrate from the node exponentially decreases with increased voltage from the node to substrate.

For the conventional refresh timing, refresh cycle time is decreased with increased $V_{CC}$. When $V_{CC}$ is constant, R in the above equation is a constant resistance, and a timing circuit designed to match the time $t_X$ given above can use a conventional resistor in place of resistor R1 in FIG. 3. However, to account for variation in $V_{CC}$ according to the present invention, resistor R1 in FIG. 3 tracks the exponential voltage dependency of the leakage resistance. R1 includes a resistor formed of active area in the substrate in a way to be discussed with reference to FIG. 4. Such a resistor has increasing resistance with increasing $V_{CC}$. As resistance increases, the period of signals at nodes 172, 174, and 140 increases, producing a lower oscillator frequency and, therefore, an increased refresh cycle time. Additionally, the switching threshold voltage of each transistor Q12 through Q18 is adjusted during fabrication to match the cell threshold voltage.

In a second embodiment, a decreasing refresh cycle time will result from increasing $V_{CC}$, where C1 includes a capacitor formed in a way identical to the memory cell capacitor. In this case, C1 has similar leakage characteristics as already described above for the cell capacitor. The time $t_Y$, representing a half period of oscillator 116, can be modeled to include the effect of a leakage resistance $R_L$ in parallel with capacitor C1. As leakage current increases, the period $$t_Y = (R_1 \| R_L) * C_1 * \ln \frac{V_{CC}(R_1 \| R_L)}{V_{CC}(R_1 \| R_L) - V_X * R_1}$$

of signals at nodes 172, 174, and 140 decreases, producing a higher oscillator frequency and, therefore, a decreased refresh cycle time.

Data retention time varies from lot to lot with the variation in the geometry (alignment and physical dimensions) and the material composition of the cell capacitor (extent of dopant, implanted materials, etc.). By including the equivalent of a cell capacitor in C1, the refresh timing capacitor, refresh timing more nearly matches the data retention time required by an integrated circuit of a given lot. By reducing the difference between data retention time and refresh cycle time, power dissipation savings accrues and an increasing number of integrated circuits fall within given performance specifications.

Decreasing refresh cycle time more nearly tracks decreasing data retention time in a preferred embodiment wherein the features of the first and second embodiment, discussed above, are combined. In such an embodiment, the resistance of resistor R1 increases as $V_{CC}$ increases and capacitor C1 has leakage resistance characteristics similar to a memory cell. Resistor R1 compensates for the voltage and process dependent nature of cell leakage resistance. The designer, therefore, can closely match refresh timing to data retention time at several values of $V_{CC}$. By tracking more nearly, a power dissipation savings is achieved over conventional refresh timing, especially for memory designed for more than one value for $V_{CC}$.

Multiple values for $V_{CC}$ provide two systems benefits. First, a range of values for $V_{CC}$ permits operation with less regulated power supplies. Second, a memory designed with a "sleep mode" conserves power. Such a memory has two ranges of operating voltage: a range about 5 volts for data retention and system read and write operations; and a range about 3 volts for data retention at minimum power consumption.

Figure 4:
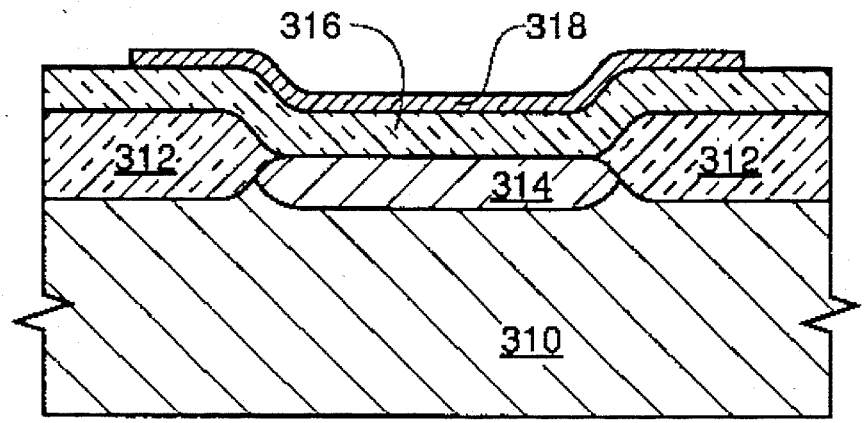
FIG. 4 is a cross sectional diagram showing the structure of resistor R1 shown in FIG. 3.

FIG. 4 is a cross sectional diagram showing the structure of resistor R1, a silicon monolithic resistor, shown in FIG. 3. Substrate 310 in one embodiment is P-silicon, biased to a negative voltage with a charge pump as is well known in the art. N-type polysilicon forms a lightly doped region 314 in substrate 310 between regions of field oxide 312. The dimensions and doping being selected to achieve a resistance in the range 400 to 800 kilohms. The region 314 primarily extends a length (not apparent in the cross sectional view) sufficient for the desired resistance value. In one embodiment, region 314 has a sheet resistivity of about 10 kilohms per square, a total resistance of about 580 kilohms, and dimensions of 2 microns wide and 116 microns long. A layer of TEOS forms a spacer 316 about 1500 Angstroms thick above which a layer of polysilicon 318 is formed to protect region 314 from contamination. Spacer 316 prevents polysilicon layer 318 from acting as a gate above region 314.

Figure 5:
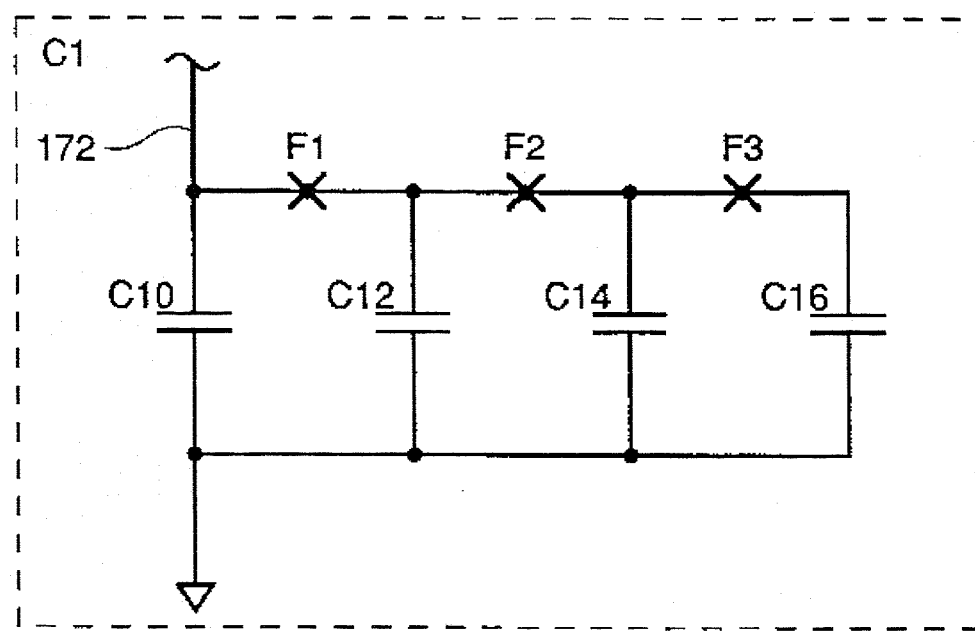
FIG. 5 is a schematic diagram of capacitor C1 shown in FIG. 3.

FIG. 5 is a schematic diagram of capacitor C1 shown in FIG. 3. A plurality of capacitors is shown coupled in parallel for providing an adjustable amount of capacitance. Fuses F1 through F3 in one embodiment are selectively blown after refresh timing has been analyzed during integrated circuit fabrication. In another equivalent embodiment, fuses F1 through F3 are replaced or used in conjunction with metal mask options. In still another embodiment, not shown, each capacitor is coupled to line 172 by a transistor similar to a memory cell access transistor with appropriate gate bias.

Alternative and equivalent resistors having voltage dependent resistance are known in the art. For example, diffusion resistors in either the base or emitter diffusions and use of diffusion well as a resistor are feasible because body effect in each of these structures operates to increase resistance with increasing substrate bias voltage.

The foregoing description discusses preferred embodiments of the present invention, which may be changed or modified without departing from the scope of the present invention.

For example, P-channel FETs discussed above may be replaced with N-channel FETs (and vice versa) in some applications with appropriate polarity changes in controlling signals as required. Moreover, the P-channel and N-channel FETs discussed above generally represent active devices which may be replaced with bipolar or other technology active devices.

Still further, those skilled in the art will understand that the logical elements described above may be formed using a wide variety of logical gates employing any polarity of input or output signals and that the logical values described above may be implemented using different voltage polarities. As an example, an AND element may be formed using an AND gate or a NAND gate when all input signals exhibit a positive logic convention or it may be formed using an OR gate or a NOR gate when all input signals exhibit a negative logic convention.

Oscillator 116, though shown as a relaxation or ring oscillator, is implemented in an alternate and equivalent embodiment (not shown) as a tuned circuit coupled to an amplifier as is well known in the art. Resistor R1 in an alternate and equivalent embodiment (not shown) is coupled through an active device to line 172 to form an effective resistance larger or smaller than the resistance of a single resistor formed as discussed above with reference to FIG. 4.

Refreshing has been described as implemented in a DRAM. In an alternate and equivalent embodiment, refresh timing according to the invention is incorporated in a refresh controller circuit packaged separate from dynamic memory. Such a refresh controller, in one embodiment, is fabricated with a DRAM device so that process variation affecting the DRAM equivalently affects the refresh controller.

These and other changes and modifications are intended to be included within the scope of the present invention.

While for the sake of clarity and ease of description, several specific embodiments of the invention have been described; the scope of the invention is intended to be measured by the claims as set forth below. The description is not intended to be exhaustive or to limit the invention to the form disclosed. Other embodiments of the invention will be apparent in light of the disclosure to one of ordinary skill in the art to which the invention applies.

The words and phrases used in the claims are intended to be broadly construed. A "system" refers generally to electrical apparatus and includes but is not limited to a packaged integrated circuit, an unpackaged integrated circuit, a combination of packaged or unpackaged integrated circuits or both, a microprocessor, a microcontroller, a memory, a register, a flip-flop, a charge-coupled device, combinations thereof, and equivalents.

A "signal" refers to mechanical and/or electromagnetic energy conveying information. When elements are coupled, a signal can be conveyed in any manner feasible in light of the nature of the coupling. For example, if several electrical conductors couple two elements, then the relevant signal comprises the energy on one, some, or all conductors at a given time or time period. When a physical property of a signal has a quantitative measure or "magnitude" and the property is used by design to control, govern, or communicate information, then the signal is said to be characterized by having a "value." For a binary signal, the two characteristic values are called logic "levels."

What is claimed is:

1. A system employing dynamic storage of information, the system comprising:
   a. a dynamic memory, powered by a power signal, for retaining the information, the memory characterized by a retention time, the retention time being responsive to the power signal;
   b. a first circuit that refreshes the memory according to a period; and
   c. a timer comprising a first device, the first device characterized by a resistance, a magnitude of the resistance being responsive to the power signal, wherein the period is responsive to a current through the first device.

2. The system of claim 1 wherein the timer further comprises:
   a. a second device characterized by a capacitance, in operation having a charge; and
   b. a switch, coupled to the first device and coupled to the second device, that controls the charge on the second device, wherein the period is responsive to the resistance and the capacitance.

3. The system of claim 2 wherein the timer further comprises an oscillator, and the oscillator comprises the switch.

4. The system of claim 3 wherein the first circuit comprises a second circuit that selects a cell in response to the oscillator.

5. The system of claim 3 wherein the oscillator is characterized by a frequency, and the frequency is responsive to the resistance and the capacitance.

6. The system of claim 1 wherein the timer further comprises:
   a. a second device characterized by a capacitance; and
   b. an amplifier, coupled to the first device and coupled to the second device, wherein the amplifier provides a gain, the gain being responsive to the resistance and the capacitance.

7. The system of claim 1 wherein:
   a. the first device is formed in a substrate, the first device comprising:
      (1) a first region, in operation having a first potential; and
      (2) a second region adjacent to the first region, the second region in operation having a second potential; and
   b. the resistance is responsive to the difference between the first potential and the second potential.

8. The system of claim 7 wherein:
   a. the first region comprises a first material of a first polarity type; and
   b. the second region comprises a substance of a second polarity type different from the first polarity type.

9. The system of claim 8 wherein the first region further comprises a polysilicon layer for protecting the first material from contamination.

10. The system of claim 1 wherein the memory comprises a cell capacitor for storing, during the retention time, a charge corresponding to the information.

11. The system of claim 10 wherein the charge, in operation, changes according to a first time constant.

12. The system of claim 11 wherein operation of the second device is characterized by a second time constant, and the second time constant approximates the first time constant.

13. The system of claim 10 wherein:
   a. the cell capacitor is characterized by a first physical geometry;
   b. the second device is characterized by a second physical geometry; and
   c. the second physical geometry approximates the first physical geometry.

14. A dynamic memory for use with a refresh controller, the memory comprising:
   a. a cell that stores a bit, the cell characterized by a retention time for retaining the bit, the retention time responsive to a power signal;
   b. a first circuit that reads the bit from the cell; and
   c. a timer comprising a first device characterized by a resistance responsive to the power signal, wherein the timer, according to a period and in response to a current through the first device, provides a signal to the refresh controller, thereby maintaining the bit.

15. An integrated circuit employing dynamic storage of information, the circuit comprising:
   a. a dynamic memory cell that stores a bit of the information, the cell characterized by a retention time for the bit and by a cell dimension, the retention time being responsive to a power signal and to the cell dimension;
   b. a first circuit that refreshes the cell according to a period; and
   c. a second circuit that controls the first circuit, the second circuit comprising a first device characterized by a resistance, the resistance having a magnitude responsive to the power signal, wherein control comprises controlling the period in response to a current through the first device.

16. A memory formed on a substrate and powered by a power signal, the memory responsive to a data signal and an address signal, the memory comprising:

a. a first circuit, coupled to the power signal and to the substrate, wherein the first circuit provides a substrate bias voltage;

b. a plurality of dynamic cells, each cell for storing a bit conveyed by the data signal, each cell comprising a cell capacitor having a leakage characteristic and an edge-effect characteristic;

c. a second circuit that identifies a first selected cell of the plurality for access in response to the address signal;

d. an oscillator that provides a timing signal having a period, the oscillator comprising:
  (1) a resistor formed in the substrate, wherein the resistor provides a resistance, a magnitude of the resistance being responsive to the power signal and to the substrate bias voltage; and
  (2) a timing capacitor that provides a capacitance, the timing capacitor having a timing leakage characteristic approximating the leakage characteristic and a timing edge-effect characteristic approximating the edge-effect characteristic, and wherein the period is responsive to the resistance and the capacitance; and e. a third circuit, coupled to the oscillator, that identifies, in response to the timing signal, a second selected cell of the plurality and refreshes the second selected cell in response to the timing signal.

17. A method for refreshing each of a plurality of dynamic memory cells, the cells powered by a power signal, the method comprising the steps of:

a. developing a potential on a capacitor by charging;

b. determining the rate of charging by controlling the charging with a resistor, the resistor having a resistance, a magnitude of the resistance being responsive to the power signal;

c. determining a period by comparing the potential to a threshold; and d. selecting a cell of the plurality to refresh, selecting being after lapse of the period.

* * * * *

UNITED STATES PATENT AND TRADEMARK OFFICE
CERTIFICATE OF CORRECTION

PATENT NO. : 5,539,703
DATED : July 23, 1996
INVENTOR(S) : Troy A. Manning

It is certified that error appears in the above-indentified patent and that said Letters Patent is hereby corrected as shown below:

Col. 5, line 28, delete "44" and substitute therefor --144--.

Signed and Sealed this

Seventeenth Day of December, 1996

Attest:

BRUCE LEHMAN

Attesting Officer     Commissioner of Patents and Trademarks